(12) United States Patent
Sato et al.

(10) Patent No.: US 9,281,187 B2
(45) Date of Patent: Mar. 8, 2016

(54) METHOD FOR MANUFACTURING NITRIDE SEMICONDUCTOR DEVICE

(71) Applicant: SHIN-ETSU HANDOTAI CO., LTD., Tokyo (JP)

(72) Inventors: Ken Sato, Miyoshi-machi (JP); Hirokazu Goto, Minato-ku (JP); Hiroshi Shikauchi, Niiza (JP); Keitaro Tsuchiya, Takasaki (JP); Masaru Shinomiya, Annaka (JP); Kazunori Hagimoto, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/397,589

(22) PCT Filed: Apr. 19, 2013

(86) PCT No.: PCT/JP2013/002647
§ 371 (c)(1),
(2) Date: Oct. 28, 2014

(87) PCT Pub. No.: WO2013/171975
PCT Pub. Date: Nov. 21, 2013

(65) Prior Publication Data
US 2015/0126018 A1    May 7, 2015

(30) Foreign Application Priority Data
May 16, 2012    (JP) .................... 2012-112109

(51) Int. Cl.
*H01L 21/36* (2006.01)
*H01L 21/02* (2006.01)
*C23C 16/30* (2006.01)
*C30B 25/02* (2006.01)
(Continued)

(52) U.S. Cl.
CPC .......... *H01L 21/0262* (2013.01); *C23C 16/303* (2013.01); *C30B 25/02* (2013.01);
(Continued)

(58) Field of Classification Search
CPC .................... H01L 21/02389; H01L 29/2003; H01L 21/0262; H01L 21/0254; H01L 21/02381; H01L 21/02507; H01L 21/02458; H01L 29/7787; H01L 29/155; H01L 33/32
USPC ............................... 438/478; 257/19, 103, 96
See application file for complete search history.

(56) References Cited

U.S. PATENT DOCUMENTS 7,645,622 B2 *   1/2010   Fudeta et al. .................... 438/20
8,624,220 B2 *   1/2014   Horie et al. ..................... 257/13
(Continued)

FOREIGN PATENT DOCUMENTS

JP    A-2005-286319    10/2005
JP    A-2006-313890    11/2006
JP    A-2008-218479    9/2008

OTHER PUBLICATIONS

Aug. 31, 2015 Office Action issued in Taiwanese Application No. 102115894.
Nov. 18, 2014 International Preliminary Report on Patentability issued in International Application No. PCT/JP2013/002647.
International Search Report issued in International Patent Application No. PCT/JP2013/002647 dated Jun. 25, 2013.

*Primary Examiner* — Colleen A Matthews
*Assistant Examiner* — Colleen E Snow
(74) *Attorney, Agent, or Firm* — Oliff PLC (57) ABSTRACT

The invention provides a method for manufacturing a nitride semiconductor device that grows a multilayer film of a III-V group nitride semiconductor in a reaction furnace into which a III group element raw material gas and a V group element raw material gas are introduced, the method including: growing a first nitride semiconductor layer at a first raw material gas flow rate of the V group element raw material gas and a first carrier gas flow rate; and growing a second nitride semiconductor layer at a second raw material gas flow rate of the V group element raw material gas lower than the first raw material gas flow rate and a second carrier gas flow rate higher than the first carrier gas flow rate, wherein the first nitride semiconductor layer and the second nitride semiconductor layer are stacked.

8 Claims, 7 Drawing Sheets

(51) Int. Cl.
*C30B 29/40* (2006.01)
*H01L 29/778* (2006.01)
*H01L 29/15* (2006.01)
*H01L 33/32* (2010.01)
*H01L 29/20* (2006.01)

(52) U.S. Cl.
CPC ......... *C30B 29/403* (2013.01); *H01L 21/0254* (2013.01); *H01L 21/02381* (2013.01); *H01L 21/02458* (2013.01); *H01L 21/02507* (2013.01); *H01L 29/155* (2013.01); *H01L 29/7787* (2013.01); *H01L 29/2003* (2013.01); *H01L 33/32* (2013.01)

(56) References Cited

U.S. PATENT DOCUMENTS

| | | | |
|---|---|---|---|
| 8,765,222 B2 * | 7/2014 | Ooshika et al. | 427/255.32 |
| 2006/0220044 A1 | 10/2006 | Sugawara et al. | |
| 2007/0152232 A1 | 7/2007 | Kobayakawa et al. | |
| 2008/0203382 A1 | 8/2008 | Yanagihara | |
| 2008/0237569 A1 * | 10/2008 | Nago et al. | 257/13 |
| 2009/0194784 A1 * | 8/2009 | Kaji et al. | 257/103 |
| 2010/0244096 A1 * | 9/2010 | Sato | 257/190 |
| 2011/0101391 A1 * | 5/2011 | Miki et al. | 257/94 |
| 2012/0248387 A1 * | 10/2012 | Ooshika et al. | 252/519.14 |

* cited by examiner

METHOD FOR MANUFACTURING NITRIDE SEMICONDUCTOR DEVICE

BACKGROUND OF THE INVENTION

1. Field of the Invention

The present invention relates to a method for manufacturing a nitride semiconductor device that grows a multilayer film of a III-V group nitride semiconductor.

2. Description of the Related Art

A nitride semiconductor layer is generally formed on an inexpensive silicon substrate or sapphire substrate. However, a lattice constant of such a semiconductor substrate is greatly different from a lattice constant of a nitride semiconductor layer, and their thermal expansion coefficients are also different from each other. Therefore, high strain energy is generated in the nitride semiconductor layer formed on the semiconductor substrate by epitaxial growth. As a result, generation of cracks or a reduction in crystal quality is apt to occur in the nitride semiconductor layer.

To solve this problem, there has been suggested a method for arranging a buffer layer having stacked nitride semiconductor layers between a silicon substrate and a functional layer made of a nitride semiconductor (see, e.g., Patent Literature 1). To form this buffer layer, there has been adopted a method for fixing a flow rate of an ammonia ($NH_3$) gas that is a raw material of a V group element and changing a flow rate of a raw material gas of a III group element. Therefore, a ratio of the V group element and the III group element is determined by a supply amount of the raw material gas of the III group element.

Patent Literature 1: Japanese Unexamined Patent Application Publication No. 2008-218479

SUMMARY OF THE INVENTION

Under general manufacturing conditions, in formation of a stacked body of a gallium nitride (GaN) layer and an aluminum nitride (AlN) layer or a stacked body of an aluminum gallium nitride (AlGaN) layer and an AlN layer that is a current main stream of the buffer layer, a vapor pressure of a trimethylaluminum (TMA) gas that is a raw material of aluminum (Al) is lower than a vapor pressure of a trimethylgallium (TMG) gas that is a raw material of gallium (Ga). Therefore, a ratio of the V group element raw material gas relative to the III group element raw material gas (which will be referred to as a "V/III ratio" hereinafter) at the time of growing the AlN layer is higher than a V/III ratio at the time of growing the GaN layer. Here, the V/III ratio at the time of growing the AlN layer is a value obtained by dividing the number of supplied moles of the ammonia gas by the number of supplied moles of the TMA gas. The V/III ratio at the time of growing the GaN layer is a value obtained by dividing the number of supplied moles of the ammonia gas by the number of supplied moles of the TMG gas.

In the GaN layer, a high V/III ratio is required in order to reduce nitrogen vacancies. On the other hand, in the AlN layer, when the V/III ratio is raised, an influence of a parasitic reaction that does not contribute to film formation increases.

It is an object of the present invention to provide a method for manufacturing a nitride semiconductor device that grows a stacked structure of III-V group nitride semiconductor layers at a V/III ratio suitable for each layer.

According to one aspect of the present invention, there is provided a method for manufacturing a nitride semiconductor device that grows a multilayer film of a III-V group nitride semiconductor in a reaction furnace into which a III group element raw material gas and a V group element raw material gas are introduced, the method comprising: (a) a step of growing a first nitride semiconductor layer at a first raw material gas flow rate of the V group element raw material gas and a first carrier gas flow rate; and (b) a step of growing a second nitride semiconductor layer at a second raw material gas flow rate of the V group element raw material gas lower than the first raw material gas flow rate and a second carrier gas flow rate higher than the first carrier gas flow rate, wherein the first nitride semiconductor layer and the second nitride semiconductor layer are stacked.

According to the present invention, it is possible to provide the method for manufacturing a nitride semiconductor device that grows the stacked structure of the III-V group nitride semiconductor layers at a V/III ratio suitable for each layer.

DETAILED DESCRIPTION OF THE PREFERRED EMBODIMENTS

An embodiment according to the present invention will now be described hereinafter with reference to the drawings. In the following description of the drawings, the same or like reference numerals denote the same or like parts. However, the drawings are schematic, and it should be noted that a relationship between thicknesses and planar dimensions, a ratio of lengths of respective portions, and others are different from real values. Therefore, specific dimensions should be determined while considering the following explanation. Further, it goes without saying that the drawings include portions with different dimension relationships or ratios.

Furthermore, the following embodiment exemplifies a device or a method for embodying the technical concept of the present invention, and the technical concept of the present invention does not specify shapes, structures, arrangements, and others of constituent components to the following. The embodiment according to the present invention can be modified in many ways in claims.

Figure 1:
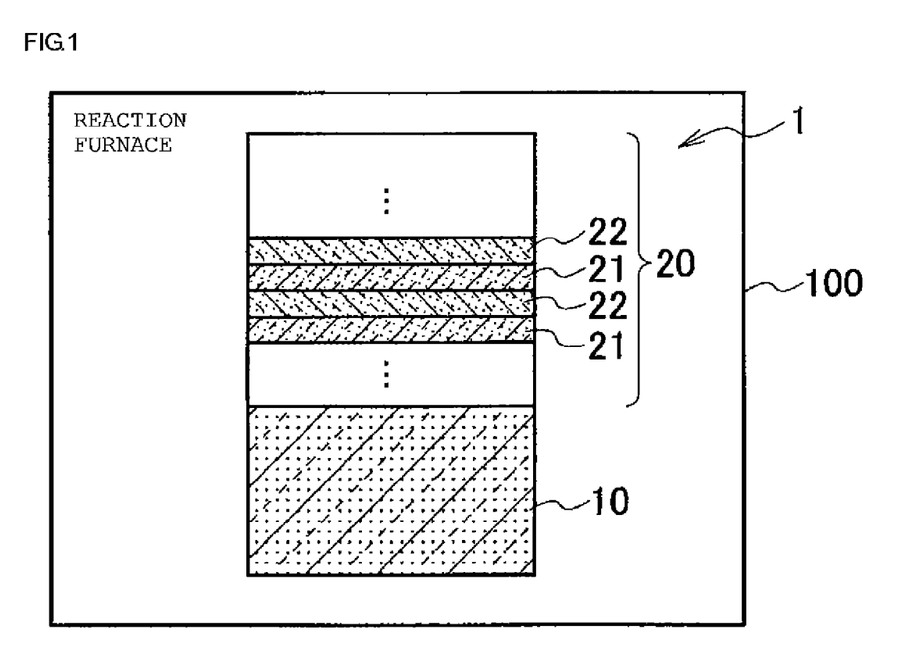
FIG. 1 is a schematic cross-sectional view showing a structure of a stacked body manufactured by a method for manufacturing a nitride semiconductor device according to an embodiment of the present invention.

FIG. 1 shows a structural example of a nitride semiconductor device 1 manufactured by a manufacturing method according to the embodiment of the present invention. The nitride semiconductor device 1 includes a semiconductor substrate 10 and a stacked body 20 arranged on the semiconductor substrate 10. The stacked body 20 is a multilayer film of III-V group nitride semiconductors. Specifically, the stacked body 20 has a structure in which first nitride semiconductor layers 21 and second nitride semiconductor layers 22 are alternately stacked. The semiconductor substrate 10 is, e.g., a silicon substrate having a lattice constant different from that of the stacked body 20.

To form the stacked body 20, the semiconductor substrate 10 is stored in a reaction furnace 100 of a film forming apparatus such as a metal organic chemical vapor deposition (MOCVD) apparatus. Moreover, a III group element raw material gas, a V group element raw material gas, and a carrier gas are supplied into the reaction furnace 100, and a step of growing the first nitride semiconductor layers 21 and the second nitride semiconductor layers 22 is repeated. As the carrier gas, a mixed gas of nitrogen and hydrogen or the like is used.

Here, it is assumed that nitride is apt to be removed and nitrogen vacancies are prone to be generated in the first nitrogen semiconductor layers 21 as compared with the second nitrogen semiconductor layers 22. Hereinafter, a case in which the first nitride semiconductor layers 21 are made of GaN and the second nitride semiconductor layers 22 are made of AlN will be exemplarily explained. Since Al has higher bonding strength with nitrogen than Ga, nitrogen is apt to be removed from the GaN layers as compared with the AlN layers.

At a step of growing each GaN layer, a raw material gas of Ga that is a III group element and a raw material gas of nitrogen that is a V group element are supplied into the reaction furnace 100 by using the carrier gas. At a step of growing each AlN layer, a raw material gas of Al that is a III group element and a raw material gas of nitrogen are supplied into the reaction furnace 100 by using the carrier gas. For example, as the raw material gas of nitrogen, an ammonia ($NH_3$) gas can be adopted. Additionally, a trimethylgallium (TMG) gas can be adopted as the raw material gas of Ga, and a trimethylaluminum (TMA) gas can be adopted as the raw material gas of Al.

Figure 2:
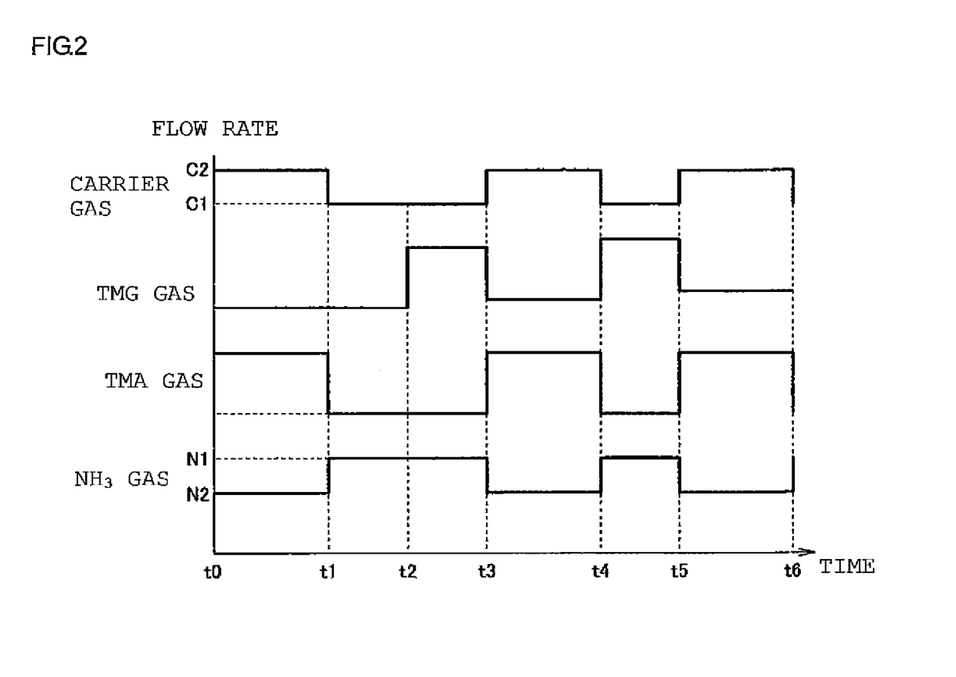
FIG. 2 is a graph showing a gas flow rate for explaining the method for manufacturing a nitride semiconductor device according to the embodiment of the present invention.

An example of a method for manufacturing the stacked body 20 of the nitrogen semiconductor device 1 will now be described with reference to FIG. 2. A vertical axis of a graph shown in FIG. 2 represents a flow rate of each gas, and a horizontal axis of the graph represents a time.

A time between t1 and t2 is a condition change period, and the raw material gas remaining in the reaction furnace 100 is exhausted from the reaction furnace 100. As a result, the V/III ratio can be precipitously changed at a subsequent film forming step.

During a time between t2 and t3, the first nitride semiconductor layer 21 made of GaN is grown. Specifically, the ammonia gas that is the V group element raw material gas is supplied to the reaction furnace 100 at a first raw material gas flow rate N1 together with the TMG gas that is the III group element raw material gas. At this time, a flow rate of the carrier gas is a first carrier gas flow rate C1. During film formation of the first nitride semiconductor layer 21, the TMA gas is not supplied.

During a time between t3 and t4, each second nitride semiconductor layer 22 made of AlN is grown. Specifically, the ammonia gas that is the V group element raw material gas is supplied into the reaction furnace 100 at a second material gas flow rate N2 lower than the first raw material gas flow rate N1 together with the TMA gas that is the III group element raw material gas. At this time, a flow rate of the carrier gas is a second carrier gas flow rate C2 higher than the first carrier gas flow rate C1. During film formation of the second nitride semiconductor layer 2, the TMG gas is not supplied.

As described above, in regard to the ammonia gas supplied into the reaction furnace 100, the second raw material gas flow rate N2 is set to be smaller than the first raw material gas flow rate N1. Particulars of flow rate adjustment of the ammonia gas will be described later. It is to be noted that the second carrier gas flow rate C2 is set in such a manner that a total gas flow rate supplied to the reaction furnace 100 during growth of each second nitride semiconductor layer 22 becomes substantially equal to a total gas flow rate during growth of each first nitride semiconductor layer 21. Therefore, the carrier gas is supplied at the second carrier gas flow rate C2 higher than the first carrier gas flow rate C1.

Then, during a time between t4 and t5, the first nitride semiconductor layer 21 made of GaN is grown like the time between t2 and t3. Further, during a time between t5 and t6, the second nitride semiconductor layer 22 made of AlN is grown like the time between t3 and t4. Thereafter, the first nitride semiconductor layer 21 and the second nitride semiconductor layer 22 are alternately grown, thereby forming the stacked body 20.

It is to be noted that FIG. 2 shows an example where, during a time between t0 and t1, the TMA gas and the ammonia gas are supplied into the reaction furnace 100 and an AlN initial layer is formed on the semiconductor substrate 10. The AlN initial layer is a nitride semiconductor layer that is in contact with the semiconductor substrate 10 as part of a buffer layer, and it is formed with a larger thickness than that of the first nitride semiconductor layer 21 or the second nitride semiconductor layer 22. A kind and a flow rate of a raw material gas that is used for forming the AlN initial layer are the same as those of the second nitride semiconductor layer 22 made of AlN. However, the AlN initial layer does not have to be formed.

The flow rate adjustment of the ammonia gas will now be explained. As described above, the second raw material gas flow rate N2 is set to be smaller than the first raw material gas flow rate N1. Because the first nitride semiconductor layer 21 made of GaN and the second nitride semiconductor layer 22 made of AlN have different optimum values of a ratio of the number of moles in the raw material gas for the V group element relative to the number of moles in the raw material gas for the III group element (V/III ratio) during the growth.

As described above, nitrogen is apt to be removed from the GaN layer and nitrogen vacancies are prone to be generated in the GaN layer as compared with the AlN layer. Therefore, to improve crystallinity, a high V/III ratio is demanded for the growth of the GaN layer. Specifically, the V/III ratio suitable for the growth of the GaN layer is appropriately 500 to 2500.

Usually, to suppress generation of the nitrogen vacancies in the GaN layer, the flow rate of the ammonia gas is set to provide the V/III ratio suitable for the growth of the GaN layer. Therefore, as shown in, e.g., FIG. 3, when the flow rate of the ammonia gas that is the V group element raw material gas is fixed and a kind of the III group element raw material gas to be supplied is just changed, the V/III ratio during the growth of the second nitride semiconductor layer 2 made of AlN is higher than the V/III ratio during the growth of the first nitride semiconductor layer 21 made of GaN. Because a vapor pressure of TMA is lower than that of TMG.

Figure 3:
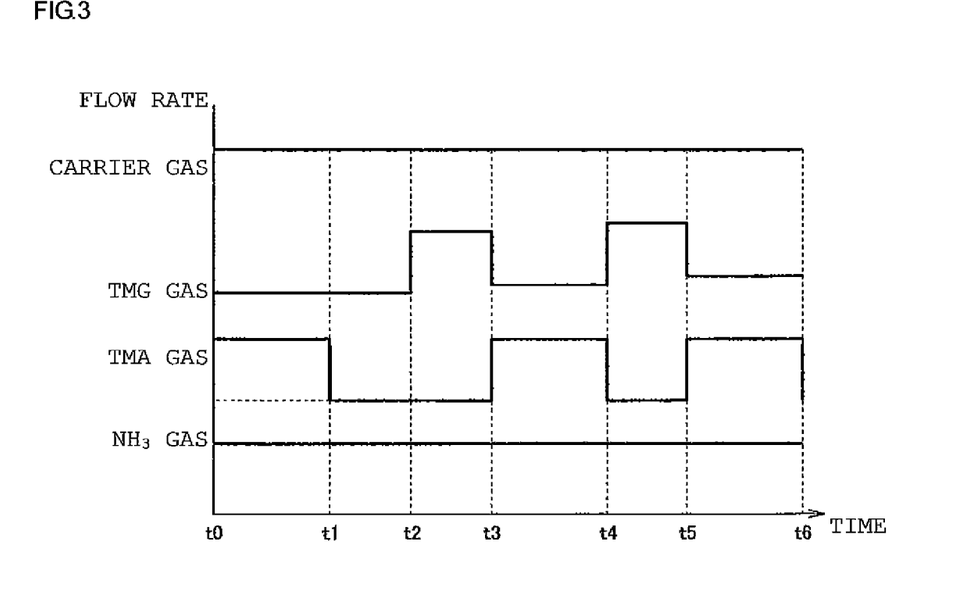
FIG. 3 is a graph showing a gas flow rate for explaining a manufacturing method according to a comparative example.

When the TMA gas is allowed to flow while maintaining the flow rate of the ammonia gas suitable for the growth of the GaN layer and the AlN layer is grown as shown in FIG. 3, the V/III ratio during the growth of AlN layer is higher than that during the growth of GaN layer, and it is 2000 to 7500. This V/III ratio is too high for optimum conditions of the AlN layer. When the V/III ratio of the AlN layer is raised, an influence of a parasitic reaction that does not contribute to the film formation is increased. As a result, a reduction in growth rate, a reduction of material efficiency, and the like become remarkable.

On the other hand, when the flow rate of the ammonia gas is set to provide the V/III ratio suitable for the AlN layer, the GaN layer grown at the set flow rate of the ammonia gas has degraded characteristics because of a too low V/III ratio.

However, in the manufacturing method shown in FIG. 2, the flow rate (the second raw material gas flow rate N2) of the ammonia gas during the growth of the second nitride semiconductor layer 22 made of AlN is set to be smaller than the flow rate (the first raw material gas flow rate N1) of the ammonia gas during the growth of the first nitride semiconductor layer 21 made of GaN. As a result, the second nitride semiconductor layer 22 can be grown under growth conditions close to the optimum conditions for the growth of the AlN layer. For example, when the second raw material gas flow rate N2 is set to be a half of the first raw material gas flow rate N1, the V/III ratio during the growth of the second nitride semiconductor layer 22 can be reduced to approximately 1000 to 4000, which is lower than that in case in which the flow rate of the ammonia gas suitable for the growth of the GaN layer is maintained.

As described above, according to the manufacturing method of the embodiment of the present invention, the flow rates of the ammonia gas during the growth of the first nitride semiconductor layer 21 and during the growth of the second nitride semiconductor layer 22 are set such that the respective V/III ratios become optimum. As a result, the stacked body 20 having high crystal quality can be obtained.

Furthermore, the flow rate of the carrier gas is adjusted in accordance with changes in flow rate of the ammonia gas during the growth of the first nitride semiconductor layer 21 and during the growth of the second nitride semiconductor layer 22. Specifically, the flow rate of the carrier gas is increased when the flow rate of the ammonia gas is reduced, and the flow rate of the carrier gas is reduced when the flow rate of the ammonia gas is increased. As a result, the adjustment is conducted in such a manner that total gas flow rates supplied to the reaction furnace 100 during the growth of the first nitride semiconductor layer 21 and during the growth of the second nitride semiconductor layer 22 become substantially constant. Consequently, the gas can be changed within the pressure control range of the manufacturing apparatus, a gas distribution in the reaction furnace 100 can be easily maintained constant, and hence a fluctuation in growth rate can be suppressed.

A description will now be given hereinafter as to a result obtained by manufacturing respective nitride semiconductor devicees by the manufacturing method according to the embodiment of the present invention shown in FIG. 2 and the manufacturing method according to the comparative example shown in FIG. 3 and comparing characteristics thereof. It is to be noted that, as a nitride semiconductor device, a nitride semiconductor layer having a film thickness of approximately 6 μm was grown on a silicon substrate. In more detail, an AlN initial layer and a buffer layer were grown with a thickness of approximately 3 μm on the silicon substrate, and a GaN layer was grown with a thickness of approximately 3 μm on the buffer layer. The buffer layer has a structure formed by stacking the AlN layer and the GaN layer. In the manufacturing method according to the embodiment of the present invention, a flow rate of an ammonia gas during growth of the GaN layer was increased and a flow rate of a carrier gas was reduced as compared with manufacturing conditions of the comparative example. As a result, according to each of the manufacturing method of the embodiment of the present invention and the manufacturing method of the comparative example, a gas flow rate that is allowed to flow into a reaction furnace was set to be substantially constant.

Figure 4:
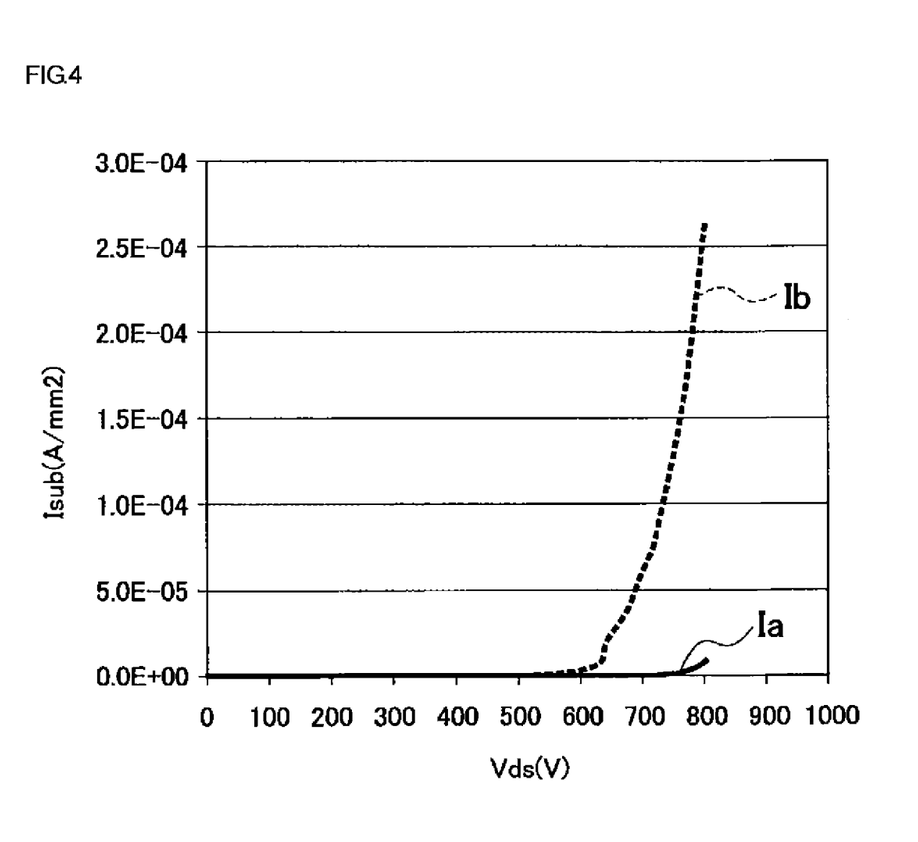
FIG. 4 is a graph showing a result of comparing characteristics of nitride semiconductor devicees manufactured by the manufacturing method according to the embodiment of the present invention and the manufacturing method according to the comparative example, respectively.

FIG. 4 shows a result of measuring leak currents in longitudinal direction of a nitride semiconductor device manufactured by the manufacturing method according to the embodiment of the present invention and the same manufactured by the manufacturing method according to the comparative example. A vertical axis in FIG. 4 represents a leak current Isub, and a horizontal axis in FIG. 4 represents an applied voltage Vds. In FIG. 4, a leak current of the nitride semiconductor device manufactured by the manufacturing method according to the embodiment of the present invention is represented as Ia, and a leak current of the nitride semiconductor device manufactured by the manufacturing method according to the comparative example is represented as Ib.

As shown in FIG. 4, the leak current Ia according to the manufacturing method of the embodiment of the present invention is $\frac{1}{10}$ or less of the leak current Ib according to the manufacturing method of the comparative example when 800 V is applied. That is, according to the manufacturing method of the embodiment of the present invention, the nitride semiconductor device having a high breakdown voltage can be realized.

Figure 5:
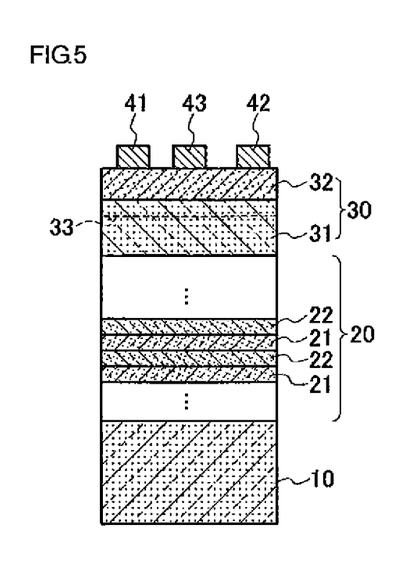
FIG. 5 is a schematic cross-sectional view showing an example of the nitride semiconductor device manufactured by the manufacturing method according to the embodiment of the present invention.

FIG. 5 shows an example that the stacked body 20 in which the GaN layers and the AlN layers are stacked is used as a buffer layer. A nitride semiconductor device shown in FIG. 5 is an example of using the stacked body 20 as the buffer layer to form a high electron mobility transistor (HEMT). That is, the nitride semiconductor device shown in FIG. 5 has a functional layer 30 in which a carrier supply layer 32 and a carrier transit layer 31 that forms a heterojunction with the carrier supply layer 32 are stacked. A heterojunction plane is formed on an interface between the carrier transit layer 31 and the carrier supply layer 32 that are made of nitride semiconductors having different band gap energies from each other, and a two-dimensional carrier gas layer 33 as a current path (a channel) is formed in the carrier transit layer 31 near the heterojunction plane.

Further, a source electrode 41, a drain electrode 42, and a gate electrode 43 are formed on the functional layer 30. The source electrode 41 and the drain electrode 42 are made of a metal that can achieve low-resistance contact (ohmic resistance) with the functional layer 30. For example, Al, titanium (Ti), or the like can be adopted for the source electrode 41 and the drain electrode 42. Alternatively, as a stacked body of Ti and Al, each of the source electrode 41 and the drain electrode 42 is formed. For example, nickel gold (NiAu) or the like can be adopted for the gate electrode 43 arranged between the source electrode 41 and the drain electrode 42.

Although the example that the nitride semiconductor device using the stacked body 20 is the HEMT has been shown above, a transistor having any other structure, e.g., a field effect transistor (FET) may be formed with the use of the stacked body 20.

Although the case in which the GaN layers and the AlN layers are stacked has been described as the illustrated example, a similar explanation can be applied even though the stacked body 20 has any other structure. In case of growing a nitride semiconductor layer including a plurality of III group elements like aluminum gallium nitride layers represented by composition formulas $Al_xGa_{1-x}N$ and $Al_yGa_{1-y}N$ ($0 \leq x \leq 1$, $0 \leq y \leq 1$, $x<y$), flow rates of the ammonia gas and the carrier gas are adjusted in accordance with the composition of the layer. When a composition ratio of Al in the AlGaN layer is low, like the GaN layer, a flow rate of the ammonia gas during growth is increased. On the other hand, when a composition ratio of Al in the AlGaN layer is high, like the AlN layer, a flow rate of the ammonia gas is reduced. For example, as the buffer layer, it is possible to use the stacked body 20 having a structure in which the first nitride semiconductor layers 21 each of which is made of AlN and has a film thickness of approximately 5 nm and the second nitride semiconductor layers 22 each of which has a film thickness of approximately 30 nm and is made of AlGaN are stacked.

Indium gallium nitride layers represented by a composition formulas $In_xGa_{1-x}N$ and $In_yGa_{1-y}N$ ($0 \leq x \leq 1$, $0 \leq y \leq 1$, $x<y$) will now be described. In case of stacking GaN layers and indium nitride (InN) layers, nitrogen vacancies are apt to be generated in the indium nitride (InN) layers as compared with the GaN layers. Because Ga has stronger bonding with nitrogen than indium (In). Therefore, the V/III ratio at the time of growing the InN layer must be increased, and the V/III ratio at the time of growing the GaN layer must be reduced. Accordingly, the above situation is realized by increasing the flow rate of the ammonia gas at the time of growing the InN layer and reducing the flow rate of the ammonia gas at the time of growing the GaN layer. As a result, it is possible to obtain the stacked body 20 in which each InN layer is formed as the first nitride semiconductor layer 21 and each GaN layer is formed as the second nitride semiconductor layer 22. At the time, the flow rate of the carrier gas is increased or decreased in accordance with an increase/decrease in flow rate of the ammonia gas. As described above, adjustment of the flow rates of the ammonia gas and the carrier gas in accordance with a combination of the layers to be stacked.

Figure 6:
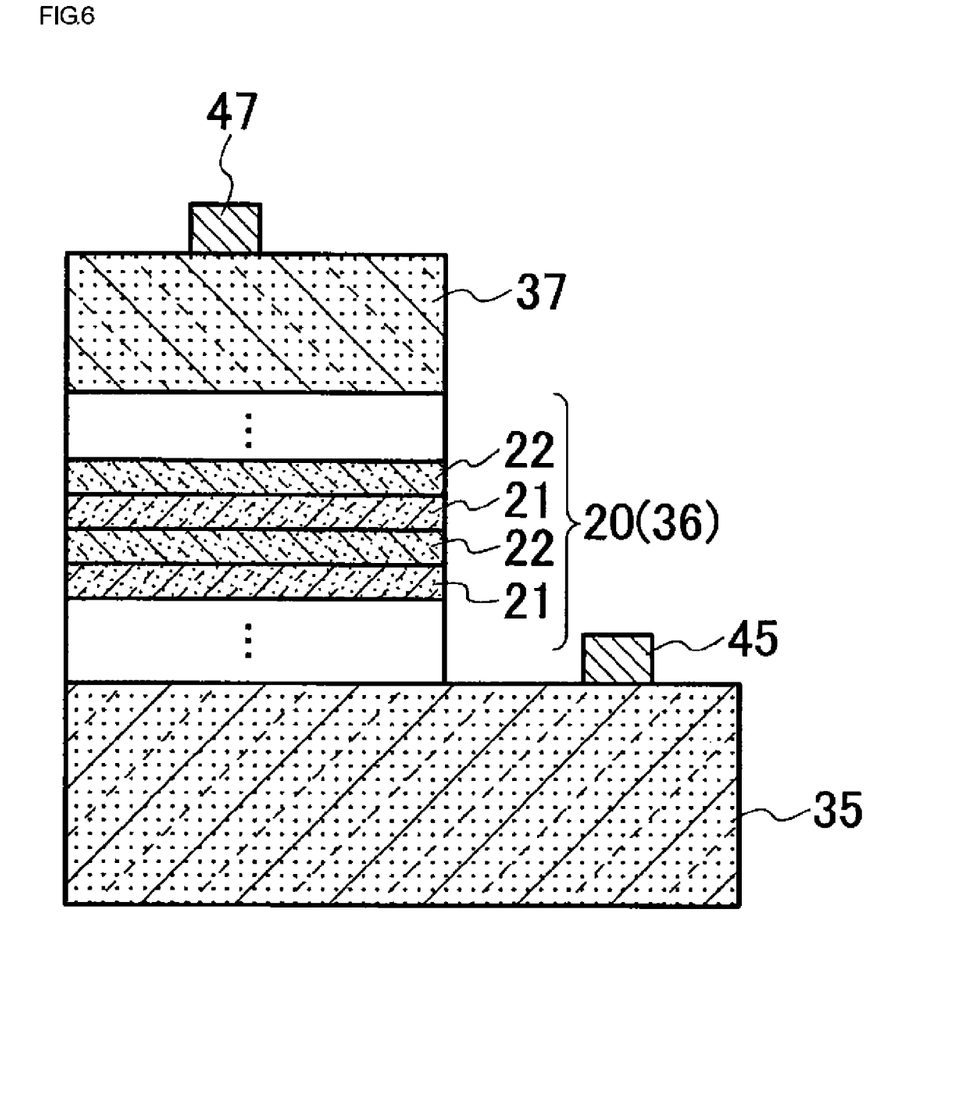
FIG. 6 is a schematic cross-sectional view showing another example of the nitride semiconductor device manufactured by the manufacturing method according to the embodiment of the present invention.

The stacked layer 20 may be used as not only the buffer layer but also a superlattice layer. FIG. 6 shows an example where the stacked layer 20 is used as an active layer 36 of a light emitting device. The active layer 36 shown in FIG. 6 has a multiple quantum well (MQW) structure in which barrier layers and well layers having a smaller band gap than the barrier layers are alternately arranged, and a stacked structure of first nitride semiconductor layers 21 made of indium gallium nitride (InGaN) and second nitride semiconductor layers 22 made of GaN can be adopted as this MQW structure. Electrons supplied from an n-type clad layer 35 and positive holes supplied from a p-type clad layer 37 are recombined, and light is thereby generated. It is to be noted that a semiconductor substrate is omitted in FIG. 6.

The n-type clad layer 35 is, e.g., a GaN layer having an n-type impurity doped therein. As shown in FIG. 6, an n-side electrode 45 is connected to the n-type clad layer 35, and electrons are supplied to the n-side electrode 45 from a negative power supply provided outside the light emitting device. As a result, the electrons are supplied to the active layer 36 from the n-type clad layer 35. The p-type clad layer 37 is, e.g., an AlGaN layer having a p-type impurity doped therein. A p-side electrode 47 is connected to the p-type clad layer 37, and positive holes (holes) are supplied to the p-side electrode 47 from a positive power supply provided outside the light emitting device. As a result, the positive holes are supplied to the active layer 36 from the p-type clad layer 37.

Figure 7:
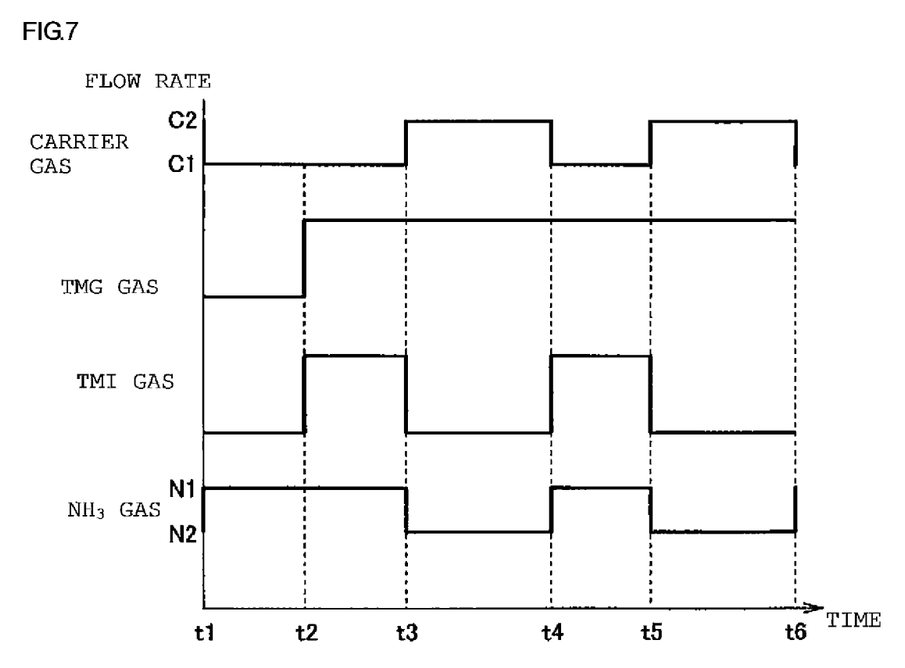
FIG. 7 is a graph showing gas flow rates for explaining another method for manufacturing a nitride semiconductor device according to the embodiment of the present invention.

FIG. 7 shows an example of gas flow rates for forming the stacked body 20 of the first nitride semiconductor layer 21 made of InGaN and the second nitride semiconductor layer 22 made of GaN as the active layer 36. A time between t1 and t2 in FIG. 7 is a condition changing period. The InGaN layer is framed during a time between t2 and t3, and the GaN layer is formed during a time between t3 and t4. Then, the InGaN layer is formed during a time between t4 and t5, and the GaN layer is formed during a time between t5 and t6. Subsequently, the InGaN layers and the GaN layers are alternately formed, and the active layer 36 constituted of the stacked body of the InGaN layers and the GaN layers is formed.

The V/III ratio at the time of growing the InGaN layer, i.e., a value of "the number of moles of the ammonia gas/(the number of moles of the TMG gas+the number of moles of a trimethylindium (TMI) gas)" is set to approximately 500 to 25000. When the GaN layer is grown while allowing the TMG gas alone to flow while maintaining the flow rate of the ammonia gas under this condition, the V/III ratio at the time of growing the GaN layer is increased in accordance with a reduction in TMI gas. Specifically, the V/III ratio at the time of growing the GaN layer is 10000 to 50000 that is approximately double the V/III ratio at the time of growing the InGaN layer.

This V/III ratio condition is too high, and it is greatly far from the optimum growth condition for the GaN layer. Therefore, as shown in FIG. 7, the V/III ratio is lowered by reducing the flow rate of the ammonia gas to bring this ratio closer to the optimum growth condition for the GaN layer. For example, the flow rate of the ammonia gas at the time of growing the GaN layer (the second raw material gas flow rate N2) is reduced to a half of the flow rate of the ammonia gas at the time of growing the GaN layer (the first raw material gas flow rate N1). As a result, the V/III ratio at the time of growing the GaN layer can be set to approximately 5000 to 25000 that is a half of the counterpart when maintaining the flow rate of the ammonia gas suitable for the growth of the InGaN layer.

At this time, the second carrier gas flow rate C2 is set in such a manner that a total gas flow rate supplied to the reaction furnace 100 at the time of growing the GaN layer becomes equal to a total gas flow rate at the time of growing the InGaN layer. That is, the carrier gas is supplied at the second carrier gas flow rate C2 higher than the first carrier gas flow rate C1.

It is to be noted that the n-type clad layer 35 or the p-type clad layer 37 may be a superlattice layer using the stacked body 20.

As described above, in the method for manufacturing a nitride semiconductor device according to the embodiment of the present invention, at the time of switching the growth of the first nitride semiconductor layer 21 and the growth of the second nitride semiconductor layer 22 in the stacked body 20, a kind of the raw material gas of the III group element and the flow rates of the raw material gas of the V group element and the carrier gas are changed. As a result, the first nitride semiconductor layer 21 and the second nitride semiconductor layer 22 can be grown at the respective suitable V/III ratios. Consequently, the stacked body 20 having the high crystal quality is formed.

It is to be noted that fixing the flow rate of the ammonia gas at the time of growing the CaN layer and the AlN layer and increasing the flow rate of the TMA gas to realize the V/Ill ratio suitable for the AlN layer can be considered, but realization is difficult. That is because the range of the flow rate of the raw material optimum for film formation is determined, and efficient film formation cannot be carried out even if the flow rate is increased beyond this range.

As described above, although the present invention has been described based on the embodiment, it should not be understood that the description and the drawings forming part of this disclosure restrict the present invention. Various alternative embodiments, examples, and operation technologies will become obvious to persons skilled in the art from this disclosure. That is, it is needless to say that the present inven-

The invention claimed is:

1. A method for manufacturing a nitride semiconductor device that grows a multilayer film of a III-V group nitride semiconductor in a reaction furnace into which a III group element raw material gas and a V group element raw material gas are introduced, the method comprising:
   growing a first nitride semiconductor layer at a first raw material gas flow rate of the V group element raw material gas and a first carrier gas flow rate; and
   growing a second nitride semiconductor layer at a second raw material gas flow rate of the V group element raw material gas lower than the first raw material gas flow rate and a second carrier gas flow rate higher than the first carrier gas flow rate,
   wherein;
   the first nitride semiconductor layer and the second nitride semiconductor layer are stacked;
   a ratio of the V group element raw material gas to the III group element raw material gas (V/III ratio) in the step of growing the first nitride semiconductor layer is higher than a V/III ratio in step of growing the second nitride semiconductor layer; and
   the first nitride semiconductor layer is a GaN layer and the second nitride semiconductor layer is an AlN layer.

2. The method for manufacturing a nitride semiconductor device according to claim 1, wherein the first and second raw material gas flow rates are set in such a manner that the V/III ratio becomes suitable for each of the first and second nitride semiconductor layers.

3. The method for manufacturing a nitride semiconductor device according to claim 2, wherein the V group element raw material gas is an ammonia gas.

4. The method for manufacturing a nitride semiconductor device according to claim 3, wherein the second nitride semiconductor layer is grown in such a manner that a total gas flow rate supplied to the reaction furnace becomes substantially equal to a total gas flow rate at the time of growing the first nitride semiconductor layer.

5. The method for manufacturing a nitride semiconductor device according to claim 2, wherein the second nitride semiconductor layer is grown in such a manner that a total gas flow rate supplied to the reaction furnace becomes substantially equal to a total gas flow rate at the time of growing the first nitride semiconductor layer.

6. The method for manufacturing a nitride semiconductor device according to claim 1, wherein the V group element raw material gas is an ammonia gas.

7. The method for manufacturing a nitride semiconductor device according to claim 6, wherein the second nitride semiconductor layer is grown in such a manner that a total gas flow rate supplied to the reaction furnace becomes substantially equal to a total gas flow rate at the time of growing the first nitride semiconductor layer.

8. The method for manufacturing a nitride semiconductor device according to claim 1, wherein the second nitride semiconductor layer is grown in such a manner that a total gas flow rate supplied to the reaction furnace becomes substantially equal to a total gas flow rate at the time of growing the first nitride semiconductor layer.

* * * * *